United States Patent
Tadano

(10) Patent No.: US 10,593,717 B2
(45) Date of Patent: Mar. 17, 2020

(54) IMAGE PROCESSING APPARATUS, IMAGE PROCESSING METHOD, AND IMAGING APPARATUS

(71) Applicant: Sony Semiconductor Solutions Corporation, Kanagawa (JP)

(72) Inventor: Ryuichi Tadano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/328,241

(22) PCT Filed: Jul. 21, 2015

(86) PCT No.: PCT/JP2015/003640
§ 371 (c)(1),
(2) Date: Jan. 23, 2017

(87) PCT Pub. No.: WO2016/017107
PCT Pub. Date: Feb. 4, 2016

(65) Prior Publication Data
US 2017/0214890 A1    Jul. 27, 2017

(30) Foreign Application Priority Data
Jul. 31, 2014    (JP) .................................. 2014-155662

(51) Int. Cl.
*H01L 27/146*    (2006.01)
*H04N 9/04*    (2006.01)
(Continued)

(52) U.S. Cl.
CPC ........ *H01L 27/14621* (2013.01); *G02B 5/201* (2013.01); *G02B 5/208* (2013.01);
(Continued)

(58) Field of Classification Search
CPC .............. H01L 27/14621; H04N 9/04; H04N 2209/045–046; G02B 5/201; G02B 5/208; G06T 7/50
See application file for complete search history.

(56) References Cited

U.S. PATENT DOCUMENTS 5,168,327 A  * 12/1992  Yamawaki ............. G01B 11/24
                                                          250/201.8
6,580,557 B2 *  6/2003  Huang ............... G02B 27/2207
                                                          348/60
(Continued)

FOREIGN PATENT DOCUMENTS

JP      2009-276294 A    11/2009
WO    WO 2014/019339 A1    2/2014

OTHER PUBLICATIONS

Bando et al., Extracting Depth and Matte using a Color Filtered Aperture, ACM Transactions on Graphics 27(5), Dec. 2008, 9 pages.

*Primary Examiner* — Lin Ye
*Assistant Examiner* — Chriss S Yoder, III
(74) *Attorney, Agent, or Firm* — Wolf, Greenfield & Sacks, P.C.

(57) ABSTRACT

An imaging device that includes a first color filter, a second color filer and an image sensor. The first color filter includes a first plurality of color filter regions that transmit a color of a first set of colors. The second color filter includes that transmit a color of a second set of colors. The second set of colors is different from the first set of colors. The image sensor detects light that passes through both the first color filter and the second color filter and generates an image signal.

15 Claims, 14 Drawing Sheets

(51) Int. Cl.
*H04N 13/214* (2018.01)
*G02B 5/20* (2006.01)
*G06T 7/50* (2017.01)

(52) U.S. Cl.
CPC ............... *H04N 9/04* (2013.01); *H04N 9/045* (2013.01); *H04N 13/214* (2018.05); *G06T 7/50* (2017.01)

(56) References Cited

U.S. PATENT DOCUMENTS

| | | | |
|---|---|---|---|
| 8,902,291 B2* | 12/2014 | Hiramoto | H04N 13/0214 348/273 |
| 9,628,776 B2* | 4/2017 | Ishii | H04N 9/045 |
| 2003/0112353 A1* | 6/2003 | Morris | H04N 5/332 348/310 |
| 2007/0019806 A1* | 1/2007 | Conley | H04L 63/061 380/33 |
| 2008/0111894 A1 | 5/2008 | Tanimoto | |
| 2009/0124037 A1* | 5/2009 | Yu | H01L 27/14685 438/70 |
| 2009/0284627 A1* | 11/2009 | Bando | G06K 9/00201 348/273 |
| 2012/0087578 A1 | 4/2012 | Nakajima et al. | |
| 2012/0182395 A1 | 7/2012 | Hiramoto et al. | |
| 2012/0268574 A1 | 10/2012 | Gidon | |
| 2013/0342661 A1 | 12/2013 | Ishii et al. | |

* cited by examiner

FIG. 7

| PRIMARY COLOR FILTER ON APERTURE | SECONDARY COLOR FILTER ON SENSOR SURFACE | OBSERVATIONAL IMAGE |
|---|---|---|
| Ye | R | R |
|  | G | G |
|  | B | — |
| Cy | R | — |
|  | G | G |
|  | B | B |
| Mg | R | R |
|  | G | — |
|  | B | B |

FIG. 8

| PRIMARY COLOR FILTER ON APERTURE | SECONDARY COLOR FILTER ON SENSOR SURFACE | OBSERVATIONAL IMAGE |
|---|---|---|
| R | R | R |
| R | G | — |
| R | B | — |
| G | R | — |
| G | G | G |
| G | B | — |
| B | R | — |
| B | G | — |
| B | B | B |

114

IMAGE PROCESSING APPARATUS, IMAGE PROCESSING METHOD, AND IMAGING APPARATUS

TECHNICAL FIELD

The present technology relates to an image processing apparatus, an image processing method, and an imaging apparatus, and more particularly, to an image processing apparatus that can reduce moire while improving the S/N ratio by ensuring a sufficient amount of light entering the light receiving surface, an image processing method, and an imaging apparatus.

CROSS REFERENCE TO RELATED APPLICATIONS

This Application is a national stage filing under 35 U.S.C. 371 of International Patent Application Serial No. PCT/JP2015/003640, filed Jul. 21, 2015, entitled "IMAGE PROCESSING APPARATUS, IMAGE PROCESSING METHOD, AND IMAGING APPARATUS." Foreign priority benefits are claimed under 35 U.S.C. § 119(a)-(d) or 35 U.S.C. § 365(b) of Japanese application number JP2014-155662, filed Jul. 31, 2014. The entire contents of these applications are incorporated herein by reference in their entirety.

BACKGROUND ART

A technology called Color-Filtered Aperture by which a color filter is placed at the aperture of a lens unit has been suggested as a method of passively obtaining depth information while acquiring an image of an object with an image sensor (see NPL 1, for example). PTL 1 discloses a method of estimating the depth of a scene by taking advantage of the principles of Color-Filtered Aperture.

CITATION LIST

Patent Literature

PTL 1: JP 2009-276294 A

Non Patent Literature

NPL 1: Extracting Depth and Matte using a Color-Filtered Aperture by Yosuke Bando, Bing-yu Chen, Tomoyuki Nishita

SUMMARY OF INVENTION

Technical Problem

According to a technology suggested in the past, light that has entered a lens unit passes through only one of the four divisional regions of a color filter placed at the aperture of the lens unit. Therefore, the amount of light decreases to one fourth of the original amount, and the S/N ratio (Signal-to-Noise ratio) becomes lower. Also, since the light that has entered the lens unit passes through only one of the regions of the color filter, the resolution is halved in both the horizontal direction and the vertical direction, and there is a possibility that moire will appear.

Therefore, there has been a demand for a technology for reducing moire while improving the S/N ratio by ensuring a sufficient amount of light entering the light receiving surface in a case where the principles of Color-Filtered Aperture is taken advantage of.

The present technology has been made in view of these circumstances, and it is desirable to reduce moire while improving the S/N ratio by ensuring a sufficient amount of light entering the light receiving surface.

Solution to Problem

Some embodiments relate to an imaging device that includes a first color filter, a second color filter and an image sensor. The first color filter receives light and transmits a first portion of the light. The first color filter includes a first plurality of color filter regions, wherein each color filter region of the first plurality of color filter regions transmits a color of a first set of colors. The second color filter receives the first portion of the light transmitted through the first color filter and transmits a second portion of the light. The second color filter includes a second plurality of color filter regions, wherein each color filter region of the second plurality of color filter regions transmits a color of a second set of colors. The second set of colors is different from the first set of colors. The image sensor detects the second portion of the light transmitted through the second color filter and generates an image signal.

Some embodiments relate to an imaging device that includes a first color filter, a second color filter and an image sensor. The first color filter receives light and transmits a first portion of the light. The first color filter includes a first plurality of color filter regions. Each color filter region of the first plurality of color filter regions transmits a color of a first set of colors. The second color filter receives the first portion of the light transmitted through the first color filter and transmits a second portion of the light. The second color filter includes a second plurality of color filter regions. Each of the second plurality of color filter regions transmits a color of a second set of colors. The second plurality of color filter regions are arranged randomly within the second color filter. The image sensor detects the second portion of the light transmitted through the second color filter and generate an image signal.

Some embodiments relate to a method of determining depth information. The method includes irradiating a first color filter with light. The first color filter includes a first plurality of color filter regions. Each color filter region of the first plurality of color filter regions transmits a color of a first set of colors. The method also includes irradiating a second color filter with a first portion of the light transmitted through the first color filter. The second color filter includes a second plurality of color filter regions. Each color filter region of the second plurality of color filter regions transmits a color of a second set of colors. The second set of colors is different from the first set of colors. The method also includes detecting, using an image sensor, a second portion of the light transmitted through the second color filter and generating a corresponding image signal comprising a plurality of pixels. The method also includes determining depth information from the image signal.

Advantageous Effects of Invention

According to an aspect of the present technology, moire can be reduced while the S/N ratio is improved by ensuring a sufficient amount of light entering the light receiving surface. Depth information can also be obtained from the resulting signal.

The effects of the present technology are not limited to the effects described above, and may be any of the effects described in the present disclosure. Embodiments may be used in any suitable technical field. For example, embodiments may be used in technical fields where depth information is useful, such as vehicle mounted camera and medical imaging devices.

BRIEF DESCRIPTION OF DRAWINGS

FIG. 7 is a diagram for explaining observational images to be obtained from color filter arrangement to which the present technology is applied.

FIG. 8 is a diagram for explaining observational images to be obtained from conventional color filter arrangement.

DESCRIPTION OF EMBODIMENTS

The following is a description of embodiments of the present technology, with reference to the drawings. Explanation will be made in the following order.
1. Structure of an image processing apparatus
2. Principles of ensuring of incident light
3. Restoration process using compressed sensing
4. Flow of image processing
5. Structure of an imaging apparatus
<1. Structure of an Image Processing Apparatus>

Figure 1:
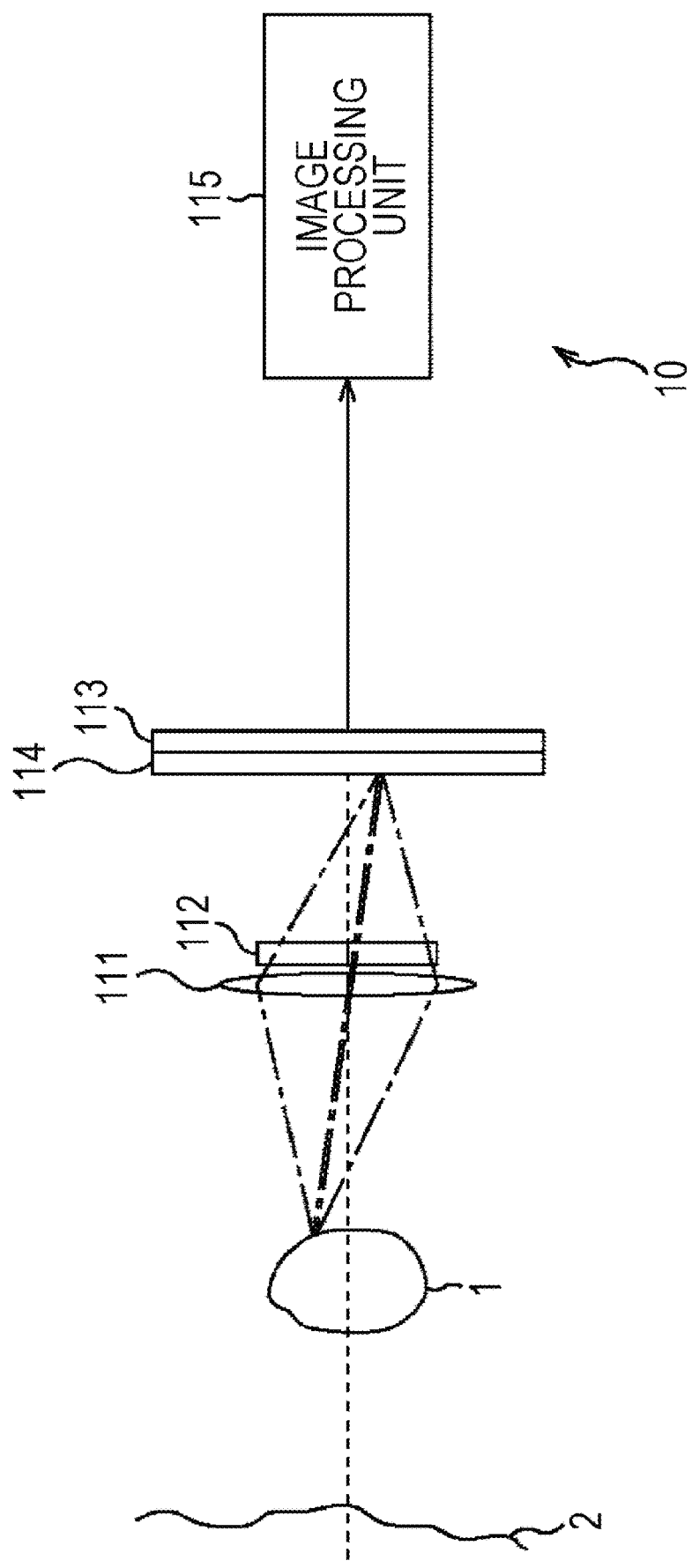
FIG. 1 is a diagram showing the structure of an embodiment of an image processing apparatus to which the present technology is applied.

FIG. 1 is a diagram showing the structure of an embodiment of an image processing apparatus to which the present technology is applied.

The image processing apparatus 10 shown in FIG. 1 has a structure in which a color filter is placed on the aperture of a lens unit to take advantage of the principles of Color-Filtered Aperture. In FIG. 1, the image processing apparatus 10 includes a lens unit 111, a primary color filter 112, an image sensor 113, a secondary color filter 114, and an image processing unit 115. In FIG. 1, the lens unit 111 and the primary color filter 112 are shown separately from each other, for ease of explanation. In practice, however, the primary color filter 112 is placed inside the lens unit 111. The secondary color filter 114 is formed integrally with the image sensor 113.

The lens unit 111 includes one or more lenses, and guides light (image light) from an object 1 located in front of a background 2 onto the light receiving surface of the image sensor 113. The primary color filter 112 is placed inside the lens unit 111.

Figure 2:
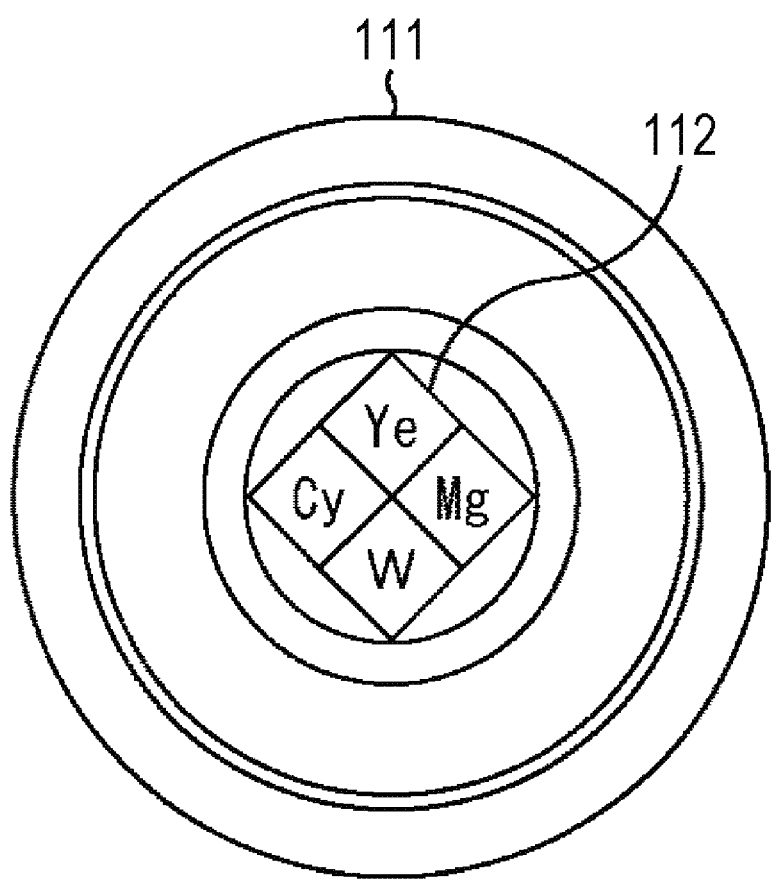
FIG. 2 is a diagram showing an example structure of the primary color filter placed at the aperture of the lens unit.

FIG. 2 shows the external appearance of the lens unit 111. In FIG. 2, the primary color filter 112 is placed at the aperture (the diaphragm portion) of the lens unit 111, and light from the object 1 enters the image sensor 113 of the later stage via the primary color filter 112. In FIG. 2, the rhomboid-shaped primary color filter 112 is divided into four regions, and the respective regions are formed with filters of the following colors: cyan (Cy), magenta (Mg), yellow (Ye), and white (W).

Referring back to FIG. 1, the image sensor 113 is a solid-state imaging device such as a CMOS (Complementary Metal Oxide Semiconductor) image sensor or a CCD (Charge Coupled Device) image sensor. The image sensor 113 includes a pixel array unit in which pixels having photoelectric conversion elements (photodiodes) are two-dimensionally arranged in a matrix fashion, and a peripheral circuit unit that drives the pixels and performs AD (Analog-to-Digital) conversion and the like.

The image sensor 113 photoelectrically converts light from the lens unit 111, and outputs the light as an image signal to the image processing unit 115. The secondary color filter 114 is placed on the front surface of the image sensor 113.

Figure 3:
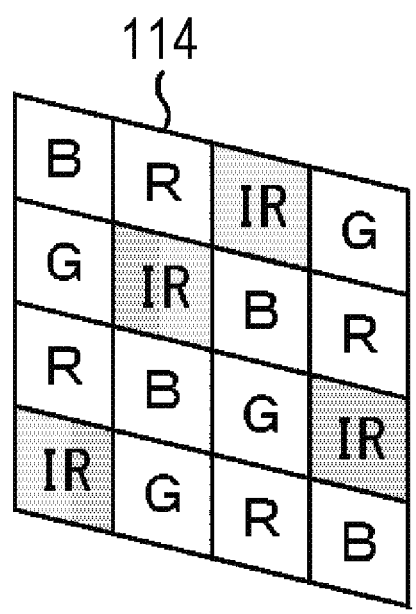
FIG. 3 is a diagram showing an example structure of the secondary color filter placed on the front surface of the image sensor.

FIG. 3 shows the external appearance of the secondary color filter 114. In FIG. 3, the secondary color filter 114 includes filters of the following colors: red (R), green (G), and blue (B). The secondary color filter 114 also includes IR (Infrared Ray) pass filters (IR) that can pass infrared rays. In this secondary color filter 114, the filters of red (R), green (G), and blue (B), and the IR pass filters (IR) are randomly arranged.

That is, the primary color filter 112 placed at the lens aperture and the secondary color filter 114 placed on the sensor pixels have different characteristics from each other, and the colors that pass through the primary color filter 112 (cyan (Cy), magenta (Mg), and yellow (Ye), which are the three primary colors in the case of subtractive color mixing) are complementary to the colors that pass through the secondary color filter 114 (red (R), green (G), and blue (B), which are the three primary colors in the case of additive color mixing).

In the description below, the respective filters of cyan (Cy), magenta (Mg), yellow (Ye), and white (W) in the primary color filter 112 will be referred to as the Cy filter, the Mg filter, the Ye filter, and the W filter. Also, the respective filters of red (R), green (G), and blue (B) in the secondary color filter 114 will be referred to as the R filters, the G filters, and the B filters.

In the description below, the color filters of cyan (Cy), magenta (Mg), and yellow (Ye) will be also referred to as the CMY filters. The color filters of red (R), green (G), and blue (B) will be also referred to as the RGB filters.

Referring back to FIG. 1, the image processing unit 115 performs predetermined image processing on the image signal that is output from the image sensor 113. This image processing may be a process of restoring an image of the object 1 (an object image) by applying compressed sensing to the image signal that is output from the image sensor 113, for example. The process of restoring the image of the object 1 (the object image) using compressed sensing will be described later in detail.

The image processing apparatus 10 shown in FIG. 1 has the above described structure. In this image processing apparatus 10, light from the object 1 is gathered by the lens unit 111 having the primary color filter 112 placed at its aperture, the light is then photoelectrically converted by the image sensor 113 having the secondary color filter 114 placed on its front surface, and the image signal obtained through the photoelectric conversion is processed by the image processing unit 115.

<2. Principles of Ensuring of Incident Light>

Next, the principles of ensuring of sufficient incident light by the light receiving surface of the image sensor 113 in the image processing apparatus 10 shown in FIG. 1 are described.

Figure 4:
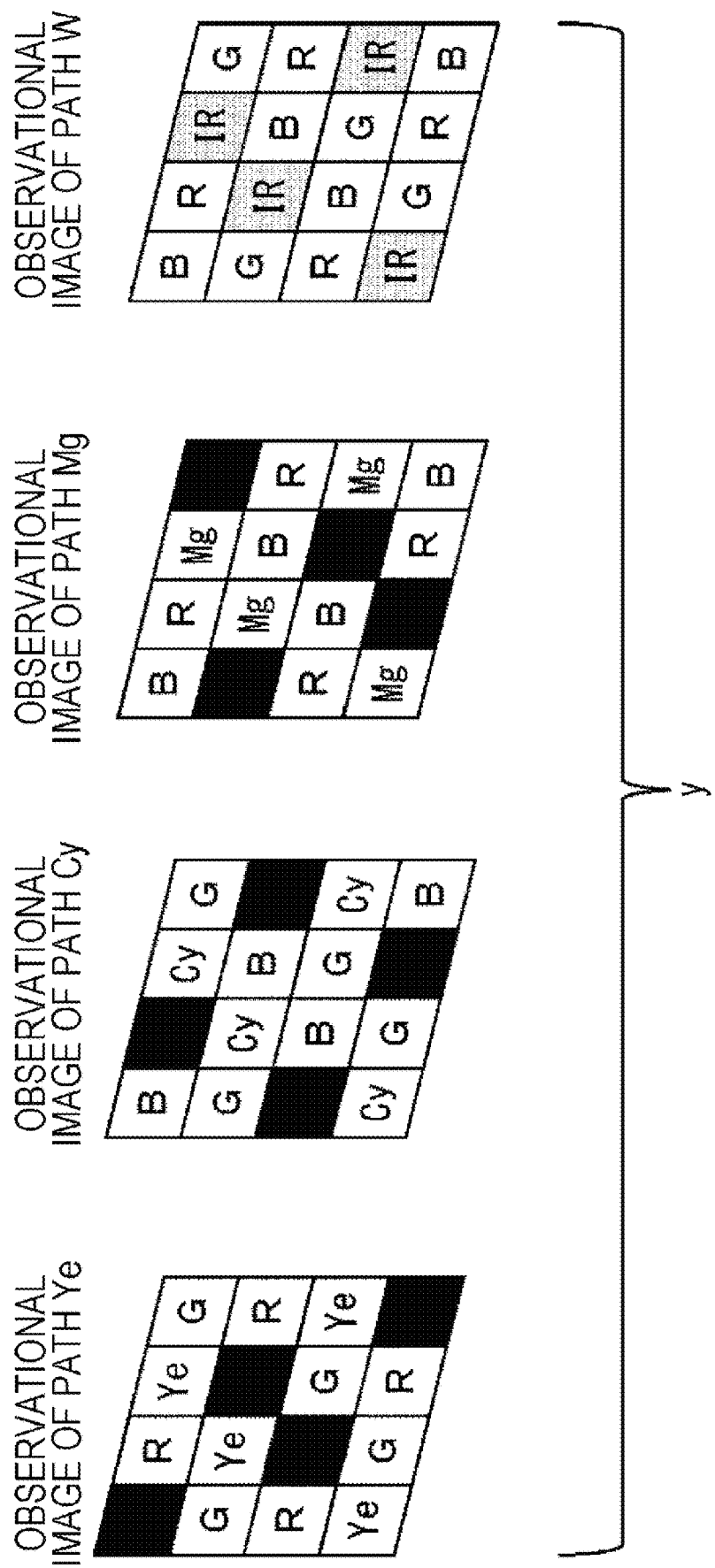
FIG. 4 is a diagram schematically showing observational images obtained from the light that has passed the respective paths.

As shown in FIG. 4, in the image processing apparatus 10 shown in FIG. 1, the image sensor 113 outputs an image signal that is observational images in accordance with the paths of light that passes through the filters of the respective colors of the primary color filter 112 placed at the aperture of the lens unit 111.

In this case, four observational images, which are an observational image of a path Ye obtained from the light that has passed through the Ye filter, an observational image of a path Cy obtained from the light that has passed through the Cy filter, an observational image of a path Mg obtained from the light that has passed through the Mg filter, and an observational image of a path W obtained from the light that has passed through the W filter, are output based on the respective paths of the light that passes through the filters of the respective colors of the primary color filter 112. In practice, an image obtained by superimposing (combining) these four observational images on one another is observed at the image processing unit 115. In the description below, this observation result will be referred to as "y".

Specifically, in the primary color filter 112, the observational image obtained from the light that has passed through the Ye filter and been received by the image sensor 113 via the secondary color filter 114 (the observational image of the path Ye in FIG. 4) includes red (R) and green (G) pixels obtained from the light that has passed through the R filters and the G filters randomly arranged in the secondary color filter 114, and yellow (Ye) pixels obtained from the light that has passed through the IR pass filters.

Figure 5:
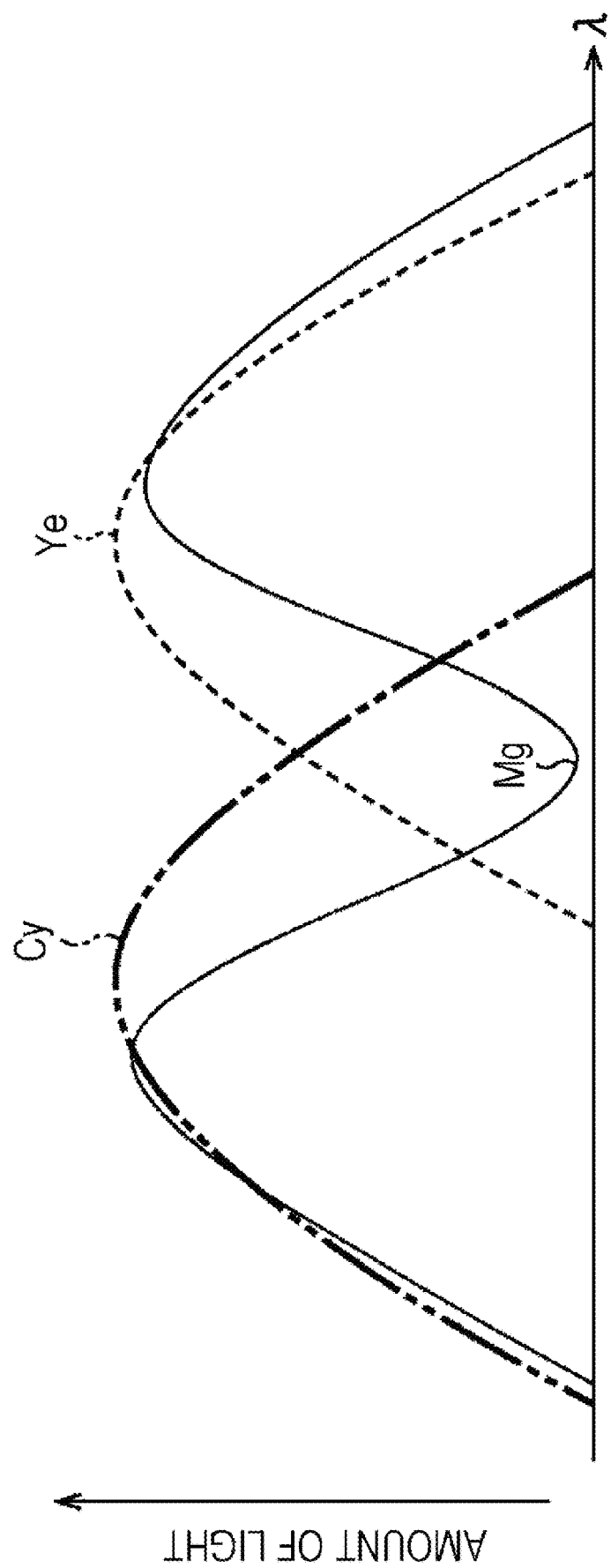
FIG. 5 is a diagram showing the amounts of light that passes through the respective filters of CMY in the respective wavelength regions.
Figure 6:
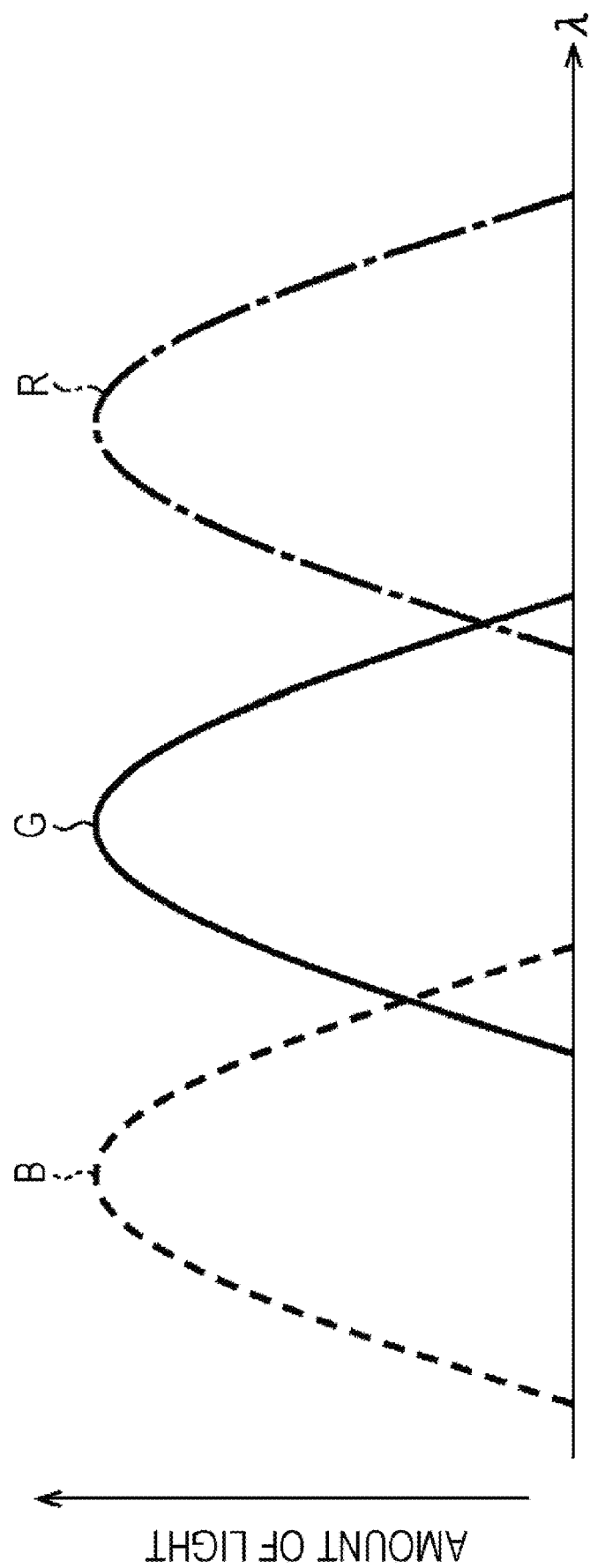
FIG. 6 is a diagram showing the amounts of light that passes through the respective filters of RGB in the respective wavelength regions.

FIG. 5 shows the characteristics of the respective filters of cyan (Cy), magenta (Mg), and yellow (Ye), which are the three primary colors in the case of subtractive color mixing. FIG. 6 shows the characteristics of the respective filters of red (R), green (G), and blue (B), which are the three primary colors in the case of additive color mixing. In FIGS. 5 and 6, the abscissa axis indicates the wavelengths of the respective colors, and the ordinate axis indicates the amounts of light that passes through the filters of the respective colors.

In accordance with the characteristics of these filters, the wavelength region of yellow (Ye) shown in FIG. 5 corresponds to the wavelength regions of red (R) and green (G) shown in FIG. 6. Accordingly, the Ye filter of the primary color filter 112 also functions as a filter that passes the red (R) component and the green (G) component, and red (R) pixels and green (G) pixels are obtained from the light that has passed through the R filters and the G filters randomly arranged in the secondary color filter 114. However, the Ye filter of the primary color filter 112 does not function as a filter that passes the blue (B) component. Therefore, blue (B) pixels are not obtained as indicated by the black squares in FIG. 4.

Also, in accordance with the characteristics of these filters, the wavelength region of cyan (Cy) shown in FIG. 5 corresponds to the wavelength regions of green (G) and blue (B) shown in FIG. 6. Therefore, the Cy filter of the primary color filter 112 also functions as a filter that passes the green (G) component and the blue (B) component, but does not function as a filter that passes the red (R) component.

Because of such characteristics of the Cy filter, the observational image of the path Cy (FIG. 4) includes green (G) pixels and blue (B) pixels obtained from the light that has passed through the G filters and the B filters randomly arranged in the secondary color filter 114, and cyan (Cy) pixels obtained from the light that has passed through the IR pass filters. In the case of the observational image of the path Cy (FIG. 4), the Cy filter does not pass the red (R) component, and therefore, red (R) pixels are not obtained as indicated by the black squares in the drawing.

Also, in accordance with the characteristics of these filters, the wavelength region of magenta (Mg) shown in FIG. 5 corresponds to the wavelength regions of ref (R) and blue (B) shown in FIG. 6. Therefore, the Mg filter of the primary color filter 112 also functions as a filter that passes the red (R) component and the blue (B) component, but does not function as a filter that passes the green (G) component.

Because of such characteristics of the Mg filter, the observational image of the path Mg (FIG. 4) includes red (R) pixels and blue (B) pixels obtained from the light that has passed through the R filters and the B filters randomly arranged in the secondary color filter 114, and magenta (Mg) pixels obtained from the light that has passed through the IR pass filters. In the case of the observational image of the path Mg (FIG. 4), the Mg filter does not pass the green (G) component, and therefore, green (G) pixels are not obtained as indicated by the black squares in the drawing.

Further, the filter of white (W) of the primary color filter 112 functions as a filter that passes all the components of red (R), green (G), and blue (B). Accordingly, the observational image of the path W (FIG. 4) includes red (R) pixels, green (G) pixels, and blue (B) pixels obtained from the light that has passed through the R filters, the G, filters, and the B filters randomly arranged in the secondary color filter 114, and pixels obtained from the light that has passed through the IR pass filters.

The structure in which the primary color filter 112 formed with the respective colors of the three primary colors (cyan (Cy), magenta (Mg), and yellow (Ye)) of the subtractive color mixing is placed at the aperture of the lens unit 111, and the secondary color filter 114 formed with the respective colors of the three primary colors (red (R), green (G), and blue (B)) of the additive color mixing is placed on the front surface of the image sensor 113 is employed as described above, so that the four observational images (the observation result y) shown in FIG. 4 are obtained.

To sum up, the Ye filter of the primary color filter 112 passes the red (R) component and the green (G) component of light that comes from the object 1 and enters the light receiving surface of the image sensor 113 from the lens unit 111. Further, the R filters of the secondary color filter 114 pass the red (R) component, and the G filters pass the green (G) component, as shown in the upper part of FIG. 7. As a result, an image including red (R) pixels and green (G) pixels is obtained as the observational image of the path Ye (FIG. 4).

Also, the Cy filter of the primary color filter 112 passes the green (G) component and the blue (B) component of the light from the object 1. Further, the G filters of the secondary color filter 114 pass the green (G) component, and the B filters pass the blue (B) component, as shown in the middle part of FIG. 7. As a result, an image including green (G) pixels and blue (B) pixels is obtained as the observational image of the path Cy (FIG. 4).

Also, the Mg filter of the primary color filter 112 passes the red (R) component and the blue (B) component of the light from the object 1. Further, the R filters of the secondary color filter 114 pass the red (R) component, and the B filters pass the blue (B) component, as shown in the lower part of FIG. 7. As a result, an image including red (R) pixels and blue (B) pixels is obtained as the observational image of the path Mg (FIG. 4).

For comparison, FIG. 8 shows observational images to be obtained in a case where a structure in which color filters each formed with the respective colors of the three primary colors (red (R), green (G), and blue (B)) of the additive color mixing are provided at the aperture of the lens unit 111 and on the front surface of the image sensor 113 is employed.

Specifically, the R filters of the primary color filter 112 placed at the aperture of the lens unit 111 pass only the red (R) component of light that comes from the object 1 and enters the light receiving surface of the image sensor 113 from the lens unit 111. Further, the R filters of the secondary color filter 114 placed on the front surface of the image sensor 113 pass only the red (R) component, as shown in the upper part of FIG. 8. As a result, an image including only red (R) pixels is obtained as an observational image of the path R.

Also, the G filters of the primary color filter 112 pass only the green (G) component of the light from the object 1, and the G filters of the secondary color filter 114 further pass only the green (G) component, as shown in the middle part of FIG. 8. As a result, an image including only green (G) pixels is obtained as an observational image of the path G.

Also, the B filters of the primary color filter 112 pass only the blue (B) component of the light from the object 1, and the B filters of the secondary color filter 114 further pass only the blue (B) component, as shown in the lower part of FIG. 8. As a result, an image including only blue (B) pixels is obtained as an observational image of the path B.

In a case where RGB filters with the same characteristics are used as the primary color filter 112 and the secondary color filter 114 as described above, each of the color filters passes only a single color component. Therefore, the amount of light that is received by the light receiving surface of the image sensor 113 becomes smaller and the S/N ratio becomes lower than in a case where CMY filters that are complementary to RGB filters are used to have different characteristics.

In the image processing apparatus 10 shown in FIG. 1, on the other hand, RGB filters are used as the secondary color filter 114 placed on the front surface of the image sensor 113 while CMY filters that are complementary to the RGB filters are used as the primary color filter 112 placed at the aperture of the lens unit 111. In this manner, the primary color filter 112 and the secondary color filter 114 are made to have different characteristics from each other. In a case where such a structure is employed, the CMY filters can pass two or more color components on to the RGB filters. Accordingly, light loss due to a filter combination can be made smaller, a larger amount of light can be ensured to be received by the light receiving surface of the image sensor 113, and the S/N ratio can be made higher than in a case where only RGB filters are used.

<3. Restoration Process Using Compressed Sensing>

Next, a restoration process to be performed by the image processing apparatus 10 shown in FIG. 1 using compressed sensing is described.

As described above, in the image processing apparatus 10 shown in FIG. 1, the image processing unit 115 applies compressed sensing to an image signal (observational images) that is output from the image sensor 113, so that an image of the object 1 (an object image (a natural image)) is restored.

Compressed sensing (Compressive Sampling) is a framework to restore a high-dimensional signal having sparsity (characteristics with a large number of zero elements) from a small number of observations. Here, the high-dimensional signal to be restored is the image of the object 1 (the object image), and the number of observations is the observation result y obtained by superimposing observational images on one another.

Figure 9:
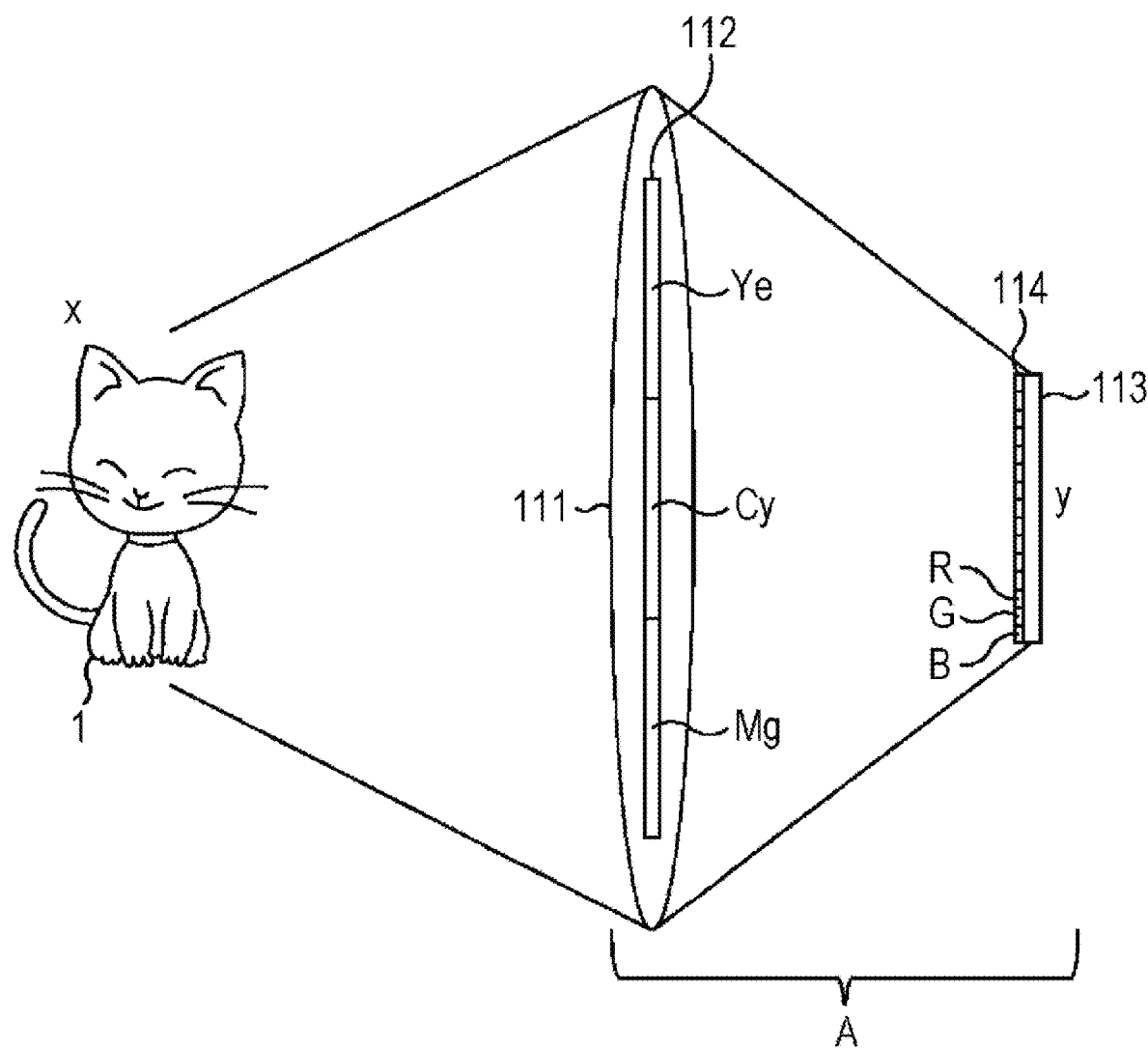
FIG. 9 is a diagram for explaining the principles of a process of restoring an object image, taking advantage of compressed sensing.

Specifically, as shown in FIG. 9, where the image signal (the image obtained by superimposing the four observational images shown in FIG. 4 on one another) that is output from the image sensor 113 is the observation result y, the image of the object 1 (the object image) is an original signal x, and the process of passing through the primary color filter 112 placed at the aperture of the lens unit 111 and the secondary color filter 114 placed on the front surface of the image sensor 113 is an observational matrix A, the following Expression (1) is true.

[Math.1]

$$y=Ax \quad (1)$$

As the simultaneous equation shown in Expression (1) is solved, the original signal x can be determined from the observation result y and the observational matrix A.

Figure 10:
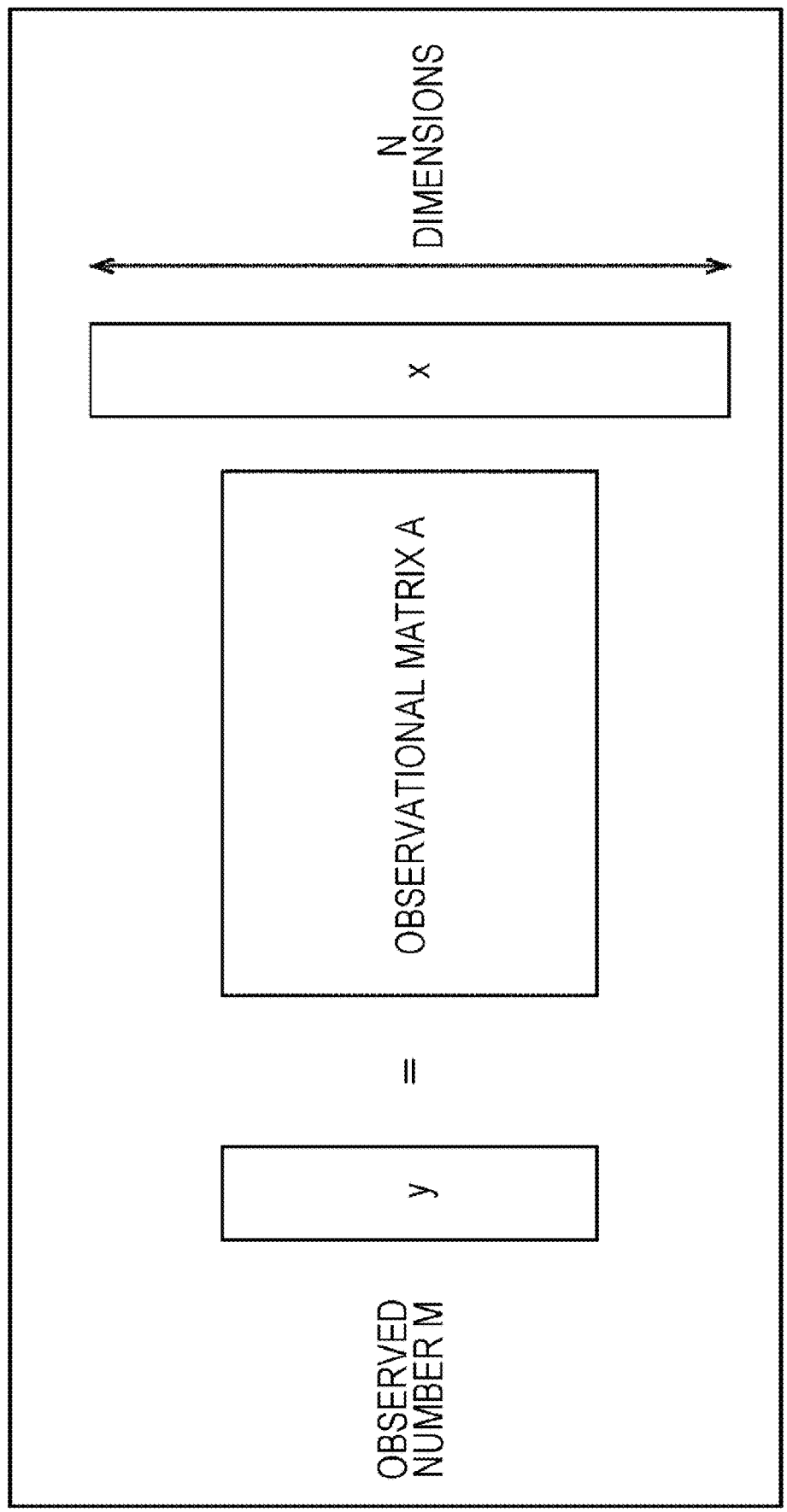
FIG. 10 is a diagram for explaining the principles of a process of restoring an object image, taking advantage of compressed sensing.

As shown in FIG. 10, the observation number M of the observation result y has lower dimensions than the N dimensions of the original signal x, and therefore, a solution is not uniquely determined. However, the facts that the N-dimensional original signal x is k-sparse and the number of non-zero elements is k are taken advantage of in this case. That is, the known characteristic of a natural image is that it contains a large number of zero elements. For example, the original signal x is restored with a certain probability by employing an L1 restoration method (an L1 reconstruction method) using the observational matrix A having random properties when the number of non-zero elements in the original signal x is smaller than the number of dimensions of the observation result y. In other words, a natural image is redundant in the spatial frequency direction, and therefore, can be restored even if the amount of sampling is reduced. This aspect is taken advantage of in this case.

Figure 11:
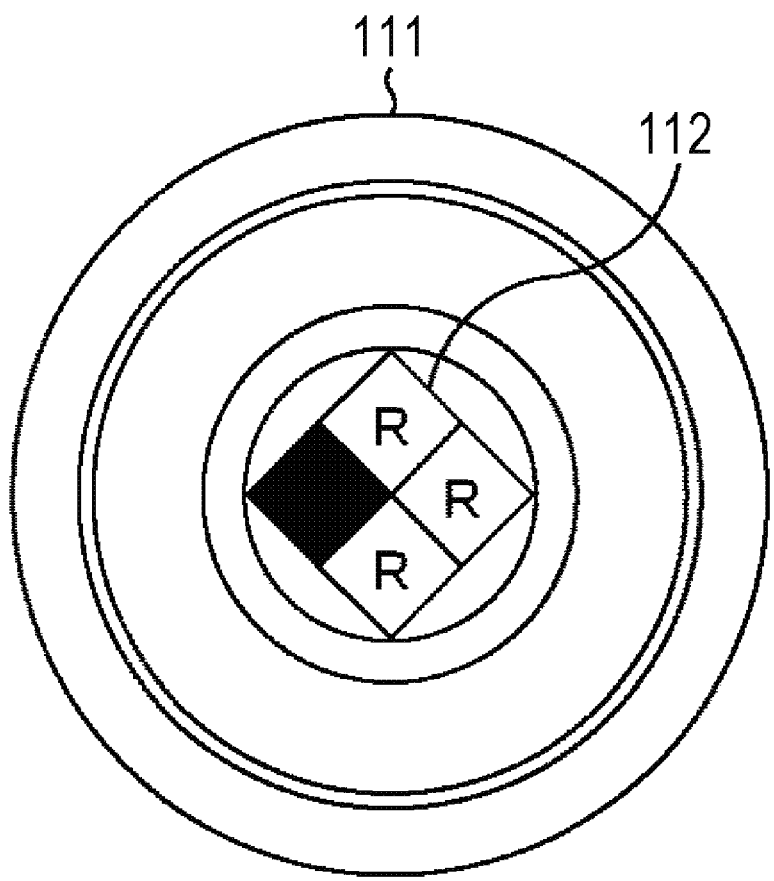
FIG. 11 is a diagram schematically showing the color component that passes through the primary color filter in a case where attention is paid to the R channels.

In a case where attention is paid to the R channels, as shown in FIG. 11, the Mg filter, the Ye filter, and the W filter in the primary color filter 112 placed at the aperture of the lens unit 111 pass the red (R) component, but the Cy filter does not pass the red (R) component as indicated by the black square in the drawing. In this case, the process in which light passes through the primary color filter 112 is defined as $B_R$. However, this $B_R$ depends on the focal position.

Figure 12:
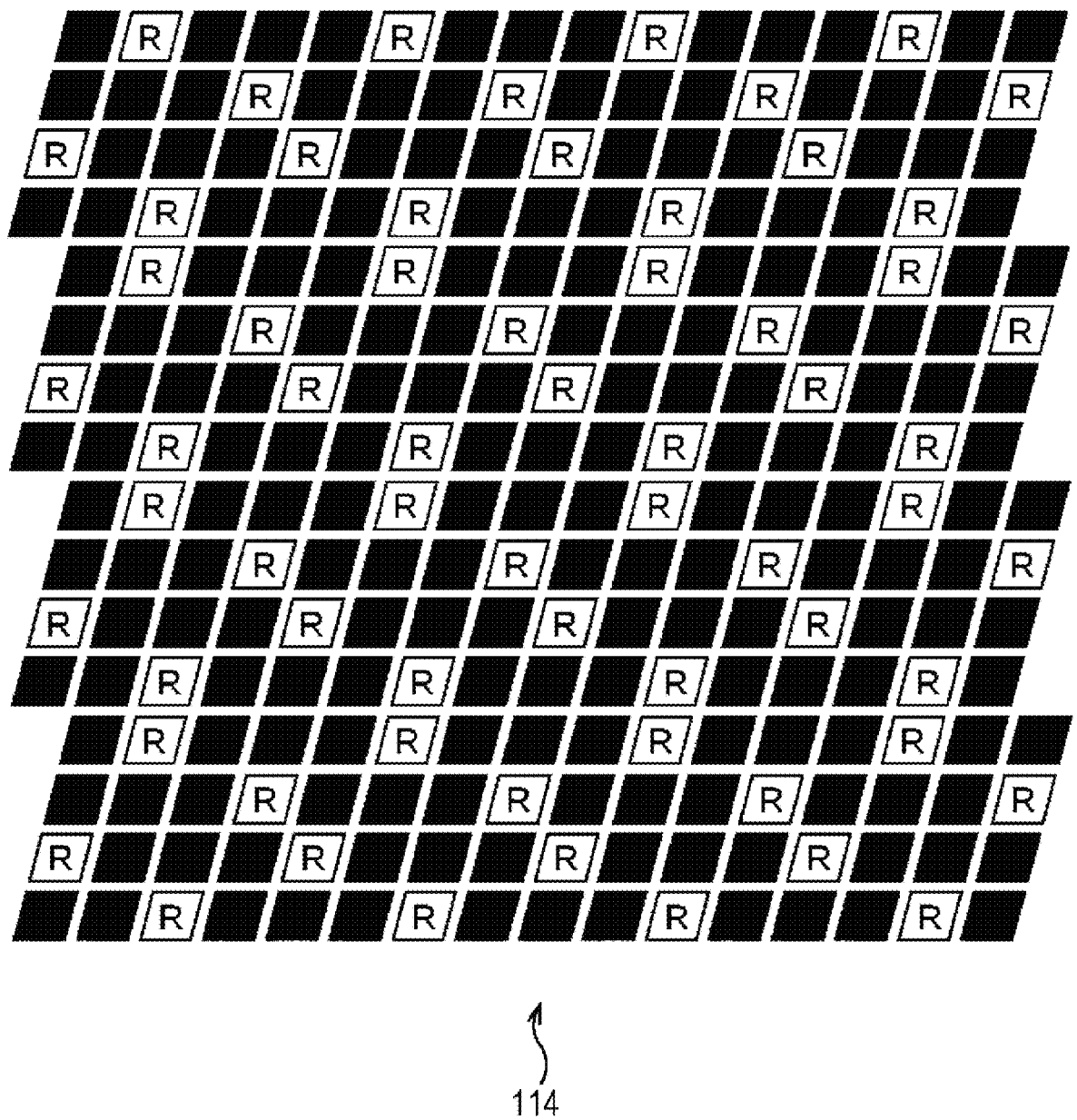
FIG. 12 is a diagram schematically showing the color component that passes through the secondary color filter in a case where attention is paid to the R channels.

In a case where attention is paid to the R channels in the secondary color filter 114 placed on the front surface of the image sensor 113, as shown in FIG. 12, the R filters pass the red (R) component, but the G filters and the B filters do not pass the red (R) component as indicated by the black squares in the drawing. In this case, the process in which light passes through the secondary color filter 114 is defined as $C_R$.

Where $B_R$ and $C_R$ are defined in the above manner, the observational matrix A representing the process of passing through the primary color filter 112 and the secondary color filter 114 can be expressed with $B_R$ and $C_R$. Accordingly, the process of restoring the object image in the R channels is realized by solving the simultaneous equation shown in the following Expression (2).

[Math.2]

$$y_R = C_R B_R x \qquad (2)$$

As is apparent from the arrangement in the secondary color filter 114 in FIG. 12, where attention is paid to the R channels, sampling can have random properties, since the R filters are randomly arranged. Also, this restoration process is performed with the information about the entire image, instead of local information. Accordingly, the amount of moire can be made smaller than in a case where conventional demosaic processing is performed.

Although a case where attention is paid to the R channels has been described above, the observational matrix A can be expressed with $B_G$ and $C_G$ or with $B_B$ and $C_B$ in the same manner as above in a case where attention is paid to the G channels or the B channels.

That is, the process of restoring the object image in the G channels is expressed by solving the simultaneous equation shown in the following Expression (3).

[Math.3]

$$y_G = C_G B_G x \qquad (3)$$

Also, the process of restoring the object image in the B channels is expressed by solving the simultaneous equation shown in the following Expression (4).

[Math.4]

$$y_B = C_B B_B x \qquad (4)$$

As described above, the image processing apparatus 10 shown in FIG. 1 has a structure that utilizes the principles of Color-Filtered Aperture by placing the primary color filter 112 at the aperture of the lens unit 111. However, RGB filters are used as the secondary color filter 114 placed on the front surface of the image sensor 113 while CMY filters that are complementary to the RGB filters are used as the primary color filter 112. In this manner, the primary color filter 112 and the secondary color filter 114 are made to have different characteristics from each other. As such a combination of CMY filters and RGB filters is employed, light loss due to a filter combination can be made smaller, a larger amount of light can be ensured to be received by the light receiving surface of the image sensor 113, and the S/N ratio can be made higher than in a case where only RGB filters are used.

In the image processing apparatus 10, the filters of the respective colors of red (R), green (G), and blue (B), and the IR pass filters (IR) are randomly arranged in the secondary color filter 114 placed on the front surface of the image sensor 113. Accordingly, the amount of moire in the object image to be restored through the restoration process can be reduced. As a result, the image processing apparatus 10 can reduce the amount of moire while improving the S/N ratio by ensuring a sufficient amount of light entering the light receiving surface of the image sensor 113.

Although the combination of the primary color filter 112 and the secondary color filter 114 is a combination of CMY filters and RGB filters in the above described example, the combination of color filters is not limited to that. For example, some other combination of color filters that have different characteristics from each other such as different wavelength regions for the same color may be employed.

Since the secondary color filter 114 placed on the front surface of the image sensor 113 includes the IR pass filters that can pass infrared rays, switching may be performed so that an infrared image is generated in a dark place or the like. However, it is arbitrary to incorporate the IR pass filters as well as the RGB filters into the secondary color filter 114.

<4. Flow of Image Processing>

Figure 13:
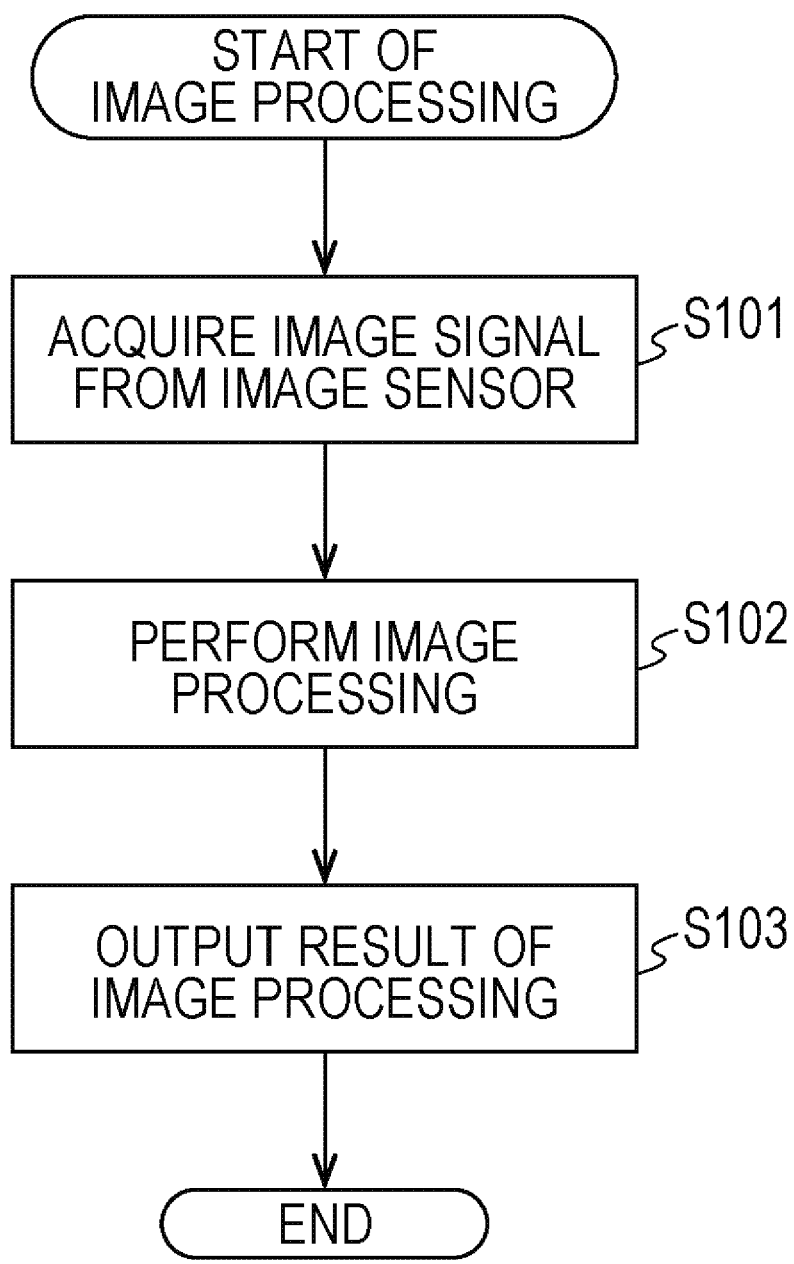
FIG. 13 is a flowchart for explaining the flow of image processing to be performed by the image processing apparatus.

Referring now to the flowchart shown in FIG. 13, the flow of image processing to be performed by the image processing apparatus 10 shown in FIG. 1 is described.

In step S101, the image processing unit 115 acquires an image signal that is output from the image sensor 113.

In step S102, the image processing unit 115 performs predetermined image processing on the image signal from the image sensor 113. As described above, this image processing may be a process of restoring the image of the object 1 (the object image) by applying compressed sensing to the image signal (observational images) from the image sensor 113.

The image processing may involve not only the process of restoring the object image, but also determination of depth information using disparity information (shift amounts of the respective colors) obtained based on the principles of Color-Filtered Aperture, for example. The depth information may be calculated by using the above described compressed sensing. For example, due to the arrangement of color filters in the primary color filter 112, the red image, blue image and green image recorded by the image sensor are displaced with respect to one another. The amount of displacement is a function of the depth of the objects in the recorded images. For example, using a thin lens approximation, the displacement amount (d) is related to the depth (D) by the following equation.

[Math.5]

$$1/D = 1/f - (1 + d/b)/a, \qquad (5)$$

Where f is the focal distance of lens unit 111, b is the displacement of the center of each of the color filters of the primary color filter 112 with respect to the center of the lens unit 111, and a is the distance between the lens unit 111 and the image sensor 113. This relationship between displacement amount (d) and depth (D) can be used to determine the depth (D) of portions of the image using techniques similar to those described in US Patent Application Publication Number 2009/0284627, filed Mar. 9, 2009, titled "Image Processing Method," which is herein incorporated by reference in its entirety.

To determine the depth of different portions of the image, first a plurality of restored images are created, each restored image compensating for a different amount of displacement for all the pixels of the image.

Second, an error is calculated for each of the pixels in each of the plurality of restored images. The error calculation may, for example, be based on a linear color model where it is assumed that natural mages are free from color displacement in a three-dimensional color space.

Third, a color displacement amount is selected for each pixel based on the calculated error associated with each of the plurality of restored images. For example, the displacement associated with the restored image with the smallest error at for a particular pixel may be selected. To increase the likelihood that the selected displacement for a particular pixel is smoothly selected relative to its surrounding pixels, an estimation method, such as a graph cut method, may be used when associating a pixel with a color displacement amount.

Finally, using formula 5 from above, the color displacement associated with each pixel is used to determine a depth associated with each pixel of the image. In this way, the depth associated with different portions of the image may be determined.

In step S103, the image processing unit 115 outputs a result of the image processing performed in step S102 to a circuit or the like in a later stage. When the processing in step S103 is completed, the image processing shown in FIG. 13 comes to an end.

The image processing to be performed by the image processing apparatus 10 shown in FIG. 1 has been described. In this image processing, light from an object is gathered by the lens unit 111 having the primary color filter 112 placed at its aperture, the light is then photoelectrically converted by the image sensor 113 having the secondary color filter 114 placed on its front surface, and the image signal obtained through the photoelectric conversion is processed by the image processing unit 115.

<5. Structure of an Imaging Apparatus>

Figure 14:
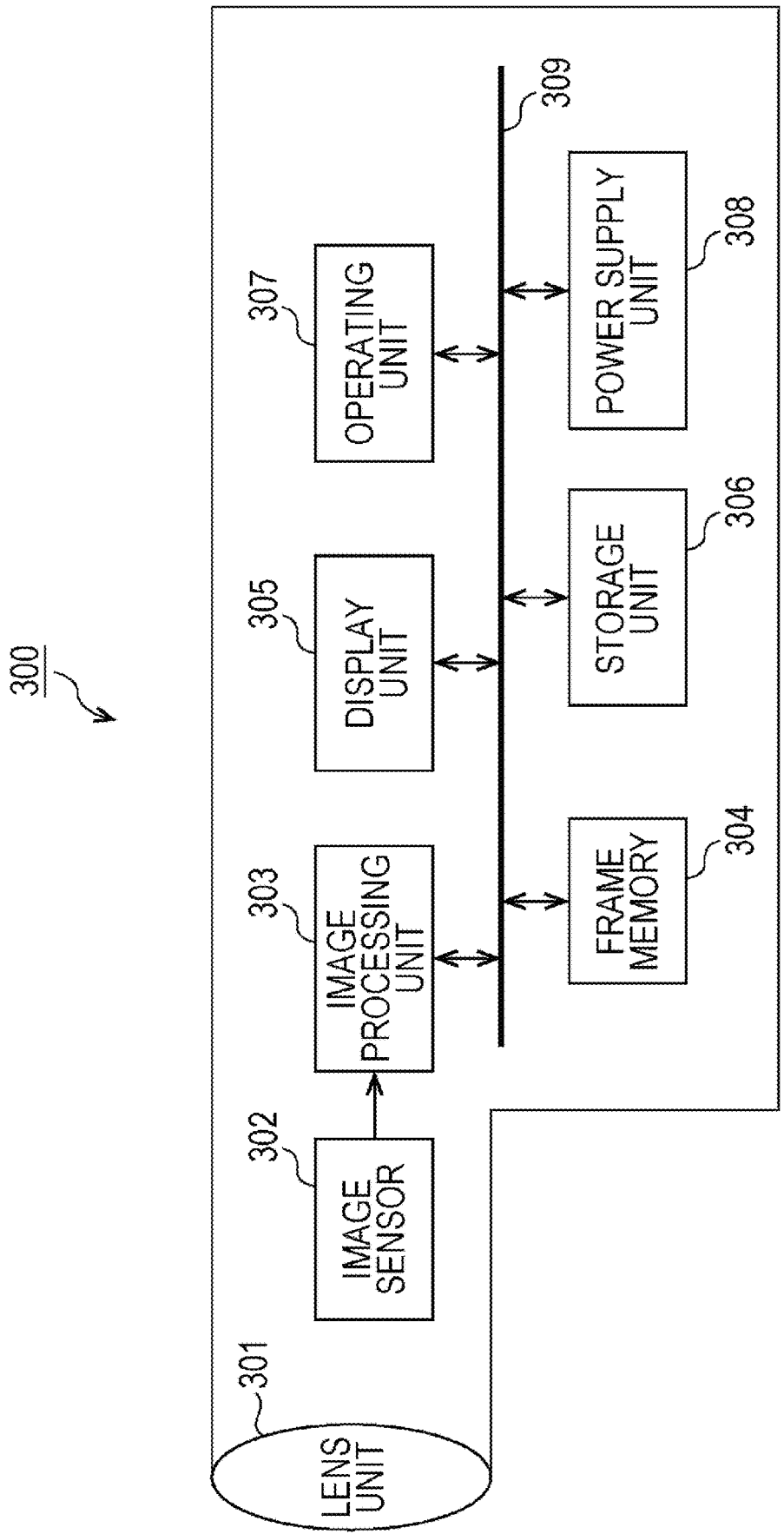
FIG. 14 is a diagram showing the structure of an embodiment of an imaging apparatus to which the present technology is applied.

FIG. 14 is a diagram showing an embodiment of an imaging apparatus to which the present technology is applied.

In FIG. 14, an imaging apparatus 300 includes a lens unit 301, an image sensor 302, an image processing unit 303, a frame memory 304, a display unit 305, a recording unit 306, an operating unit 307, and a power supply unit 308. In the imaging apparatus 300, the image processing unit 303, the frame memory 304, the display unit 305, the recording unit 306, the operating unit 307, and the power supply unit 308 are connected to one another via a bus line 309.

The lens unit 301 is equivalent to the above described lens unit 111 (FIG. 1). The lens unit 301 includes one or more lenses, and guides light (image light) from an object onto the light receiving surface of the image sensor 302. Although not shown in the drawing, a primary color filter that is divided into four regions formed with filters of the respective colors of cyan (Cy), magenta (Mg), yellow (Ye), and white (W) (the primary color filter 112 shown in FIG. 1) is placed at the aperture of the lens unit 301.

The image sensor 302 is equivalent to the above described image sensor 113 (FIG. 1) formed with a CMOS image sensor or the like. The image sensor 302 includes a pixel array unit in which pixels each including a photoelectric conversion element are two-dimensionally arranged in a matrix fashion, and a peripheral circuit unit. The image sensor 302 converts the amount of incident light forming an image on the light receiving surface through the lens unit 301, into an electrical signal pixel by pixel, and outputs the electrical signal as an image signal to the image processing unit 303. Although not shown in the drawing, a secondary color filter including filters of the respective colors of red (R), green (G), and blue (B) (the secondary color filter 114 shown in FIG. 1) is placed on the front surface of the image sensor 302.

The image processing unit 303 is equivalent to the above described image processing unit 115 (FIG. 1). The image processing unit 303 performs predetermined image processing on the image signal that is output from the image sensor 302. This image processing may be a process of restoring an object image by applying compressed sensing to the image signal that is output from the image sensor 302, for example.

The image processing unit 303 also performs camera signal processing on the image signal that is output from the image sensor 302. The image data obtained through this signal processing is temporarily stored into the frame memory 304, and is then supplied to the display unit 305 or the recording unit 306.

The display unit 305 is formed with a liquid crystal panel or an organic EL (Electro-Luminescence) panel, for example, and displays a moving image or a still image sensed by the image sensor 302. The recording unit 306 records the image data of the moving image or the still image sensed by the image sensor 302 into a recording medium such as a semiconductor memory, a video tape, or the like.

The operating unit 307 issues an operation instruction with respect to a function of the imaging apparatus 300, in accordance with an operation from a user. The power supply unit 308 supplies the image processing unit 303, the frame memory 304, the display unit 305, the recording unit 306, and the operating unit 307 with the power necessary for operations thereof.

An imaging apparatus to which the present technology is applied does not necessarily have the above described structure, and may have some other structure. For example, such an imaging apparatus may not be a digital still camera or a digital video camera, but may be an information processing apparatus having an imaging function, such as a portable telephone, a smartphone, a tablet device, or a personal computer. Alternatively, an imaging apparatus to which the present technology is applied may be a camera module that is attached to and used in some other information processing apparatus (or is mounted as an incorporated device).

The above described series of processes (the image processing shown in FIG. 13, for example) may be performed by hardware or may be performed by software. In a case where the above described series of processes are performed by software, the program that forms the software may be installed in a computer incorporated into special-purpose hardware, or may be installed from a recording medium into a general-purpose personal computer that can execute various kinds of functions by installing various kinds of programs, for example.

This recording medium may not be formed with a removable medium that is distributed so as to provide users with programs separately from a computer, such as a magnetic disk, an optical disk, a magnetooptical disk, or a semiconductor memory, but may be formed with a ROM or a recording unit that is incorporated into a computer before provided to a user and has programs recorded therein.

The program for performing the above described series of processes may be installed into a computer via a wired or wireless communication medium such as a local area network, the Internet, digital satellite broadcasting, using an interface such as a router or a modem as necessary.

It should be noted that embodiments of the present technology are not limited to the above described embodiments, and various modifications may be made to them without departing from the scope of the present technology.

For example, aspects of some configurations of various embodiments include:

(1) An imaging device comprising:

a first color filter configured to receive light and transmit a first portion of the light, the first color filter comprising a first plurality of color filter regions, wherein each color filter region of the first plurality of color filter regions transmits a color of a first set of colors;

a second color filter configured to receive the first portion of the light transmitted through the first color filter and transmit a second portion of the light, the second color filter comprising a second plurality of color filter regions, wherein each color filter region of the second plurality of color filter regions transmits a color of a second set of colors, wherein the second set of colors is different from the first set of colors; and an image sensor configured to detect the second portion of the light transmitted through the second color filter and generate an image signal.

(2) The imaging device of configuration (1), wherein the first set of colors is complementary to the second set of colors.

(3) The imaging device of configuration (2), wherein:
the first set of colors comprises cyan, magenta and yellow; and
the second set of colors comprises red, blue and green.

(4) The imaging device of configuration (3), wherein:
the first set of colors further comprises white; and
the second set of colors further infrared.

(5) The imaging device of configuration (1), wherein:
the first set of colors comprises red, blue and green; and
the second set of colors comprises cyan, magenta and yellow.

(6) The imaging device of configuration (1), wherein the second color filter is formed integrally with the image sensor.

(7) The imaging device of configuration (1), further comprising:
a lens, wherein the lens receives and transmits the first portion of the light from the first color filter.

(8) The imaging device of configuration (1), wherein the second plurality of color filter regions are arranged randomly within the second color filter.

(9) The imaging device of configuration (1), further comprising:
an image processor configured to generate depth information from the image signal.

(10) An imaging device comprising:
a first color filter configured to receive light and transmit a first portion of the light, the first color filter comprising a first plurality of color filter regions, wherein each color filter region of the first plurality of color filter regions transmits a color of a first set of colors;

a second color filter configured to receive the first portion of the light transmitted through the first color filter and transmit a second portion of the light, the second color filter comprising a second plurality of color filter regions, wherein each of the second plurality of color filter regions transmits a color of a second set of colors, wherein the second plurality of color filter regions are arranged randomly within the second color filter; and an image sensor configured to detect the second portion of the light transmitted through the second color filter and generate an image signal.

(11) The imaging device of configuration (10), wherein the first set of colors is the same as the second set of colors.

(12) The imaging device of configuration (10), wherein the first set of colors is different from the second set of colors.

(13) The imaging device of configuration (12), wherein the first set of colors is complementary to the second set of colors.

(14) The imaging device of configuration (10), further comprising:
an image processor configured to generate depth information from the image signal.

(15) The imaging device of configuration (10), wherein the second color filter is formed integrally with the image sensor.

(16) The imaging device of configuration (10), further comprising:
a lens, wherein the lens receives and transmits the first portion of the light from the first color filter.

(17) A method of determining depth information, the method comprising:
irradiating a first color filter with light, the first color filter comprising a first plurality of color filter regions, wherein each color filter region of the first plurality of color filter regions transmits a color of a first set of colors;

irradiating a second color filter with a first portion of the light transmitted through the first color filter, the second color filter comprising a second plurality of color filter regions, wherein each color filter region of the second plurality of color filter regions transmits a color of a second set of colors, wherein the second set of colors is different from the first set of colors;

detecting, using an image sensor, a second portion of the light transmitted through the second color filter and generating a corresponding image signal comprising a plurality of pixels; and determining depth information from the image signal.

(18) The method of configuration (17), further comprising:
determining a color displacement amount for each pixel of the plurality of pixels,
wherein the act of determining the depth information is based on the color displacement amount.

(19) The method of configuration (18), wherein the act of determining a color displacement amount comprises:
creating a plurality of restored images from the image signal, wherein each restored image of the plurality of restored images is associated with a respective color displacement;
calculating an error for each pixel of each restored image of the plurality of restored images; and
selecting a color displacement for each pixel based at least in part on the error associated with the respective pixel.

(20) The method of configuration (19), wherein selecting the color displacement for each pixel further comprises using a graph cut method.

REFERENCE SIGNS LIST

10 Image processing apparatus
111 Lens unit
112 Primary color filter
113 Image sensor
114 Secondary color filter
115 Image processing unit
300 Imaging apparatus
301 Lens unit
302 Image sensor
303 Image processing unit

The invention claimed is:
1. An imaging device comprising:
a first color filter configured to receive light and transmit a first portion of the light, the first color filter comprising a first plurality of color filter regions, wherein each color filter region of the first plurality of color filter regions transmits a color of a first set of colors;

a second color filter configured to receive the first portion of the light transmitted through the first color filter and transmit a second portion of the light, the second color filter comprising a second plurality of color filter regions, wherein each color filter region of the second plurality of color filter regions transmits a color of a second set of colors, wherein all the colors of the second set of colors are different from all the colors of the first set of colors; and an image sensor configured to detect the second portion of the light transmitted through the second color filter and to generate an image signal, wherein the first color filter comprises cyan, magenta, yellow and white color filter regions of equal areas, and wherein the second color filter comprises red, blue, green and infrared color filter regions.

2. The imaging device of claim 1, wherein the first set of colors is complementary to the second set of colors.

3. The imaging device of claim 1, wherein the second color filter is formed integrally with the image sensor.

4. The imaging device of claim 1, further comprising:
a lens, wherein the lens receives and transmits the first portion of the light from the first color filter.

5. The imaging device of claim 1, wherein the second plurality of color filter regions are arranged randomly within the second color filter.

6. The imaging device of claim 1, further comprising:
an image processor configured to generate depth information from the image signal.

7. An imaging device comprising:
a first color filter configured to receive light and transmit a first portion of the light, the first color filter comprising a first plurality of color filter regions, wherein each color filter region of the first plurality of color filter regions transmits a color of a first set of colors;

a second color filter configured to receive the first portion of the light transmitted through the first color filter and transmit a second portion of the light, the second color filter comprising a second plurality of color filter regions, wherein each of the second plurality of color filter regions transmits a color of a second set of colors, wherein the second plurality of color filter regions are arranged randomly within the second color filter and wherein all the colors of the first set of colors are different from all the colors of the second set of colors; and an image sensor configured to detect the second portion of the light transmitted through the second color filter and to generate an image signal, wherein the first color filter comprises cyan, magenta, yellow and white color filter regions of equal areas, and wherein the second color filter comprises red, blue, green and infrared color filter regions.

8. The imaging device of claim 7, wherein the first set of colors is complementary to the second set of colors.

9. The imaging device of claim 7, further comprising:
an image processor configured to generate depth information from the image signal.

10. The imaging device of claim 7, wherein the second color filter is formed integrally with the image sensor.

11. The imaging device of claim 7, further comprising:
a lens, wherein the lens receives and transmits the first portion of the light from the first color filter.

12. A method of determining depth information, the method comprising:
irradiating a first color filter with light, the first color filter comprising a first plurality of color filter regions, wherein each color filter region of the first plurality of color filter regions transmits a color of a first set of colors;

irradiating a second color filter with a first portion of the light transmitted through the first color filter, the second color filter comprising a second plurality of color filter regions, wherein each color filter region of the second plurality of color filter regions transmits a color of a second set of colors, wherein all the colors of the second set of colors are different from all the colors of the first set of colors;

detecting, using an image sensor, a second portion of the light transmitted through the second color filter and generating a corresponding image signal comprising a plurality of pixels, wherein the first color filter comprises cyan, magenta, yellow and white color filter regions of equal areas, and wherein the second color filter comprises red, blue, green and infrared color filter regions; and determining depth information from the image signal.

13. The method of claim 12, further comprising:
determining a color displacement amount for each pixel of the plurality of pixels,
wherein the act of determining the depth information is based on the color displacement amount.

14. The method of claim 13, wherein the act of determining a color displacement amount comprises:
creating a plurality of restored images from the image signal, wherein each restored image of the plurality of restored images is associated with a respective color displacement;
calculating an error for each pixel of each restored image of the plurality of restored images; and
selecting a color displacement for each pixel based at least in part on the error associated with the respective pixel.

15. The method of claim 14, wherein selecting the color displacement for each pixel further comprises using a graph cut method.

* * * * *